Feb. 13, 1968 J. BURNSWEIG, JR 3,369,233
WIDEBAND COHERENT FREQUENCY MODULATOR WITH DYNAMIC OFFSET
Filed May 10, 1966 2 Sheets-Sheet 1

INVENTOR.
JOSEPH BURNSWEIG, JR.,
BY J. K. Haskell
ATTORNEY.

Feb. 13, 1968 J. BURNSWEIG, JR 3,369,233

WIDEBAND COHERENT FREQUENCY MODULATOR WITH DYNAMIC OFFSET

Filed May 10, 1966 2 Sheets-Sheet 2

INVENTOR.
JOSEPH BURNSWEIG, JR.,
BY J. K. Haskell
ATTORNEY.

United States Patent Office 3,369,233

Patented Feb. 13, 1968

3,369,233

WIDEBAND COHERENT FREQUENCY MODULATOR WITH DYNAMIC OFFSET

Joseph Burnsweig, Jr., Los Angeles, Calif., assignor to Hughes Aircraft Company, Culver City, Calif., a corporation of Delaware Filed May 10, 1966, Ser. No. 549,064
9 Claims. (Cl. 343—14)

ABSTRACT OF THE DISCLOSURE

A radio frequency modulator for a transmitter which permits at least two oscillators offset in frequency to be rendered coherently offset by supplying a synchronizing drive signal derived from a first tunable oscillator through a modulator and slewing the other tunable oscillators with respect to the first from which the drive signal was derived. The coherent offset is established by mixing a coherent fixed reference frequency with the frequency of the tuned oscillator at all tuning times and applying the intermediate frequency derived through a circulator and thereby injection locking it precisely to the intermediate frequency.

Figure 3A:
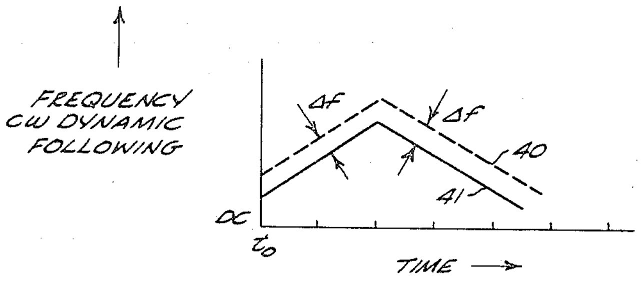

This invention relates to modulators and more particularly to an improved wideband radio frequency modulator for rapidly generating programmed coherent radio frequency intelligence in a multiple radio frequency source system and which is adjustable in frequency and time.

The operational interrelationship between the transmitter and receiver in system using coded radio frequency (RF) intelligence usually invoke limitations on bandwidth, frequency stability and electrical control loop dynamics; circuit time-delays, and equipment complexity are major design considerations. As an example, frequency diversity radar systems, which transmit two or more frequencies simultaneously or sequentially and have the transmitter and receiver at the same location, encounter the problem of programming the receiver such that it continuously tunes to the rapidly changing transmitted signal. The frequently used superheterodyne receiver requires that receiver generate a local oscillator frequency differing from the transmitted frequency by the intermediate frequency (IF) or offset frequency. As higher tuning rates are required more sophisticated automatic frequency control circuitry is required in frequency diversity transmitter-receiver units for radar and secure communications. The complex circuitry for automatic frequency control (AFC) assists the receiver in predicting the frequency of the return pulse or continuous wave transmission. Where wideband operation is required and fast tuning is essential, these intermediate frequency AFC devices introduce undesirable time delay and subsequent phase shift resulting in inadequate control loop tuning dynamics with compromised performance.

In multiple station communications, where transmitter and receiver are separated, usually a beacon signal is transmitted together with the message. On other frequencies, the beacon forms a convenient reference offset frequency for the required intermediate frequency (IF) offset oscillator in the receiver. This beacon, if required to be frequency programmed at a given offset frequency with respect to the other frequencies transmitted, demands that sophisticated AFC loop circuitry be used and operate within the control loop dynamics of the intermediate frequency circuitry and also within the requirement of minimal time delay and wide bandwidth circuitry.

Where the offset frequency is variable from a tuneable RF carrier, difficulties arise in attempts to make multiple carriers track coherently with stable offset frequency across a wide spectral bandwidth.

Similar problems arise in communications systems and high sped computers, where intelligence is transmitted in a coded, prescribed, or random manner and fast decoding access is required to the coded data.

The present invention permits the sustaining of a known relationship between two transmitted radio frequency signals, which can be simultaneously programmed across the frequency band of a tuneable RF source and maintain a precise or programmed offset frequency. This invention eliminates the complicated intermediate frequency AFC loops and permits an order of magnitude improvement in the rapid access to transmitted information by a receiver.

Accordingly, it is an object of the present invention to provide a wideband coherent frequency modulator.

Another object of the present invention is to provide a coherent IF offset from a tuneable RF carrier.

It is also an object of the present invention to provide a modulator capable of wideband operation which maintains a known relationship between two or more dynamic RF signals.

A further object of the present invention is to provide a modulator which provides a coherent dynamic offset between two dynamic RF carrier signals.

Briefly, in accordance with one embodiment of the present invention, the coherent frequency modulator having a dynamic offset employs a fixed offset oscillator, a frequency offset modulator, a circulator and a programmable power supply together with a pair of voltage tuneable oscillators and a programmer, the combination providing a fixed offset frequency between the two voltage tuneable oscillators. The programmer generates a sawtooth signal or coded voltage waveform which drives the programmable power supply. By having a prior knowledge of the desired offset, and the approximate voltage change required to drive the tuned oscillator to make such a frequency change, the power supply is provided to generate first and second voltage signals, variable with time, which are concurrently offset by a difference voltage. A first voltage signal is supplied to a first voltage tuned oscillator (VTO), which is designated as a "reference" frequency. The second voltage signal, which is offset by a predetermined difference voltage, is supplied to the second VTO. The signal from the first VTO supplies a transmitter signal and a sample for frequency translation in a frequency offset modulator; the RF sample is modulated by the output of the fixed offset frequency oscillator. When more complex modulation is desired, the offset is programmd. The output of the frequency offset modulator, which may include the carrier frequency of the first VTO and the two sides of the oscillator ($fr+fo$, $fr-fo$), is injected into a circulator, which is coupled to the second VTO. By injecting the modulated signal into the second VTO, the VTO will phase lock onto the frequency commanded by the voltage signal, rendering the output coherent and with a fixed offset with respect to the first VTO output. This action occurs at the RF circuit bandwidth. The time and frequency dynamic output signals of the two VTO's are maintained at a constant offset frequency and phase coherent with respect to any frequency changes in the reference oscillator, since the power supply voltages are strictly tuning controls.

Figure 3B:
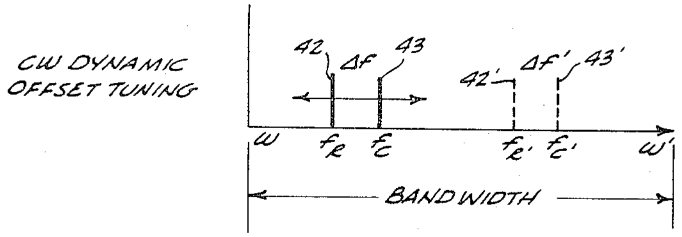
Figure 3C:
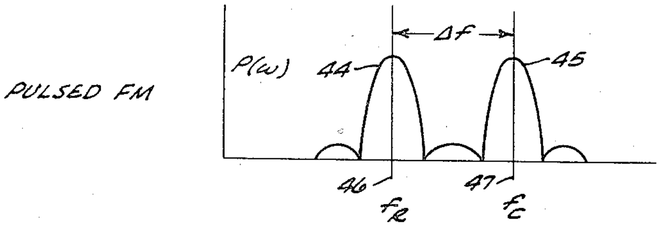
Figure 3D:
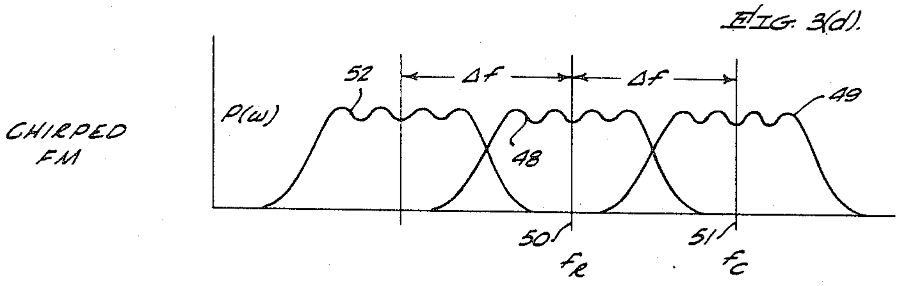
Figure 1:
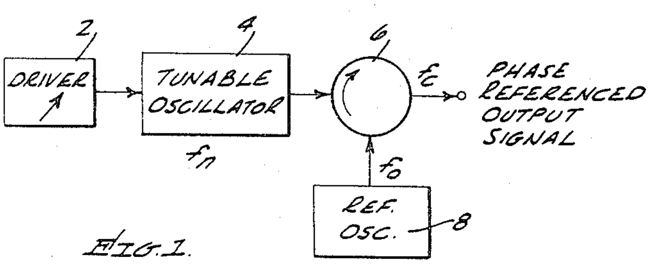
Figure 2:
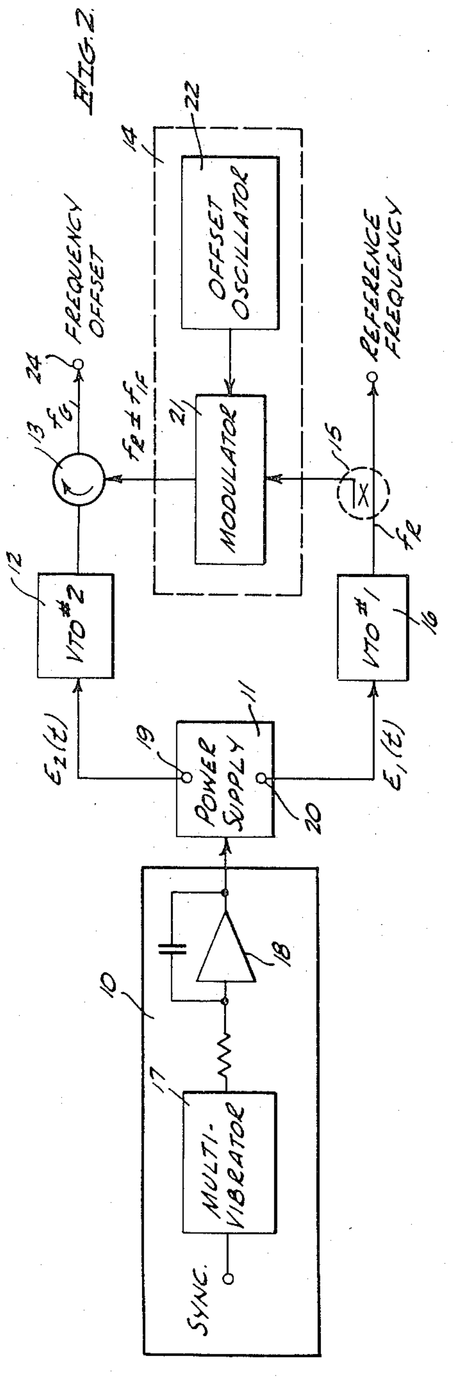
Figure 4:
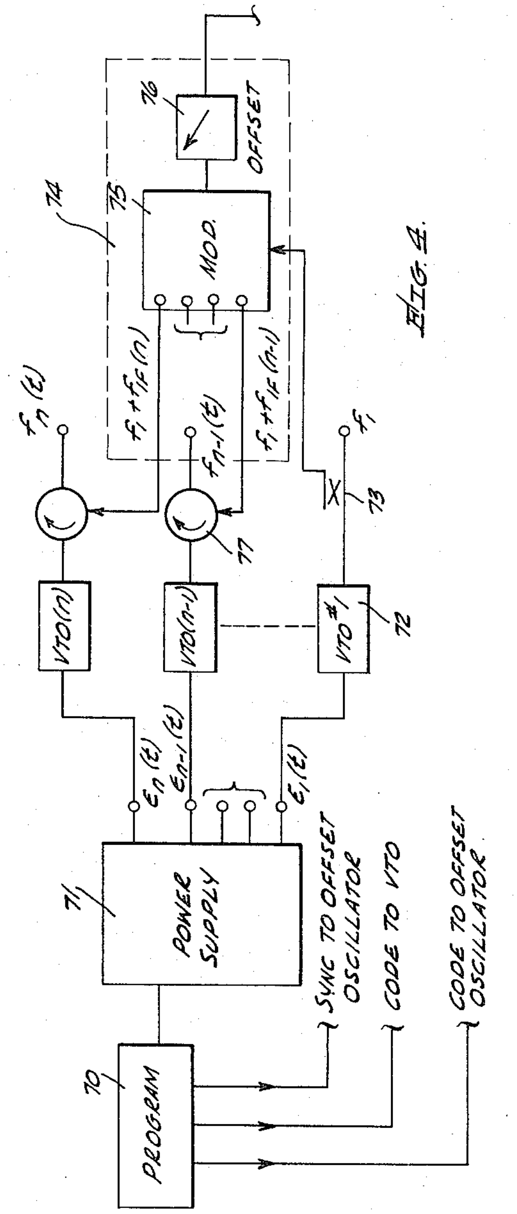

The features, objects, and advantages of the present invention can be ascertained from the following description of exemplary embodiments thereof, illustrated in the accompanying drawings wherein like reference characters refer to like parts, and wherein:

FIGURE 1 broadly illustrates the phase locking principles of the present invention;

FIG. 2 is a schematic block diagram broadly illustrating a wideband modulator for coherently generating programmable RF intelligence embodying the principles of the present invention;

FIGS. 3(*a*) through 3(*d*) graphically illustrate the variety of RF carrier intelligence which are maintained at some known relationship to each other; and FIG. 4 is a schematic diagram illustrating the generating of a plurality of wideband coherently modulated RF carriers, together with either a dynamic or fixed offset.

FIG. 1 illustrates the fundamental concepts of phase locking in an embodiment of the present invention. The coherent frequency modulator illustrated includes the variable driver 2, the tuneable oscillator 4, a network circulator 6 and the reference frequency oscillator 8. The driver 2 provides a tuning force to change the oscillation frequency of the tuneable oscillator 4. As a result of the tuning force applied to oscillator tends to oscillate at the natural frequency of oscillation $f_N$. Assuming that a constant force is applied, then by introducing an external signal of frequency $f_O$ from the reference oscillator 8 through the network circulator 6 into the tuneable oscillator 4, the natural frequency is suppressed. The introduction of the external signal is commonly referred to as "tickling." By suppressing the natural frequency through the action of the external frequency, the tuned cavity within the tuneable oscillator is altered such that an intermediate frequency $f_C$ is produced (as in frequency modulation) and the intermediate frequency is also phase-locked with the starting phase of the reference oscillator. The phenomenon of phase locking is discussed more fully in relationship to the embodiment illustrated by FIG. 2. A phase reference output signal $f_C$ is emitted from the output port of the network circulator. The driver could be a servomechanism type mechanical shaft to adjust the cavity of mechanically tuneable oscillator or a variable power supply for a voltage tuneable oscillator. The tuneable oscillator may be any of the familiar types such as klystrons, magnetrons, et cetera.

There is shown in FIG. 2 an embodiment of the wideband coherent frequency modulator of the present invention. The programmer 10 provides a coded signal to the power supply 11 which generates a pair of voltage output signals $E_1(t)$ and $E_2(t)$ based upon information contained in the coded signal. These two voltage signals are supplied to voltage tuned oscillators 12 and 16 (VTO). Mechanically tuned oscillators could also be used, but for illustration purposes voltage tuned oscillators are shown. The VTO #1 (16) oscillates at the frequency "$f_N$" in accordance with the voltage signal supplied thereto, and VTO #2 (12) will tend to oscillate at some frequency "$f_C$" in accordance with the voltage signal supplied to it. Both $f_R$ and $f_C$ are variable in time and frequency depending upon the code signal applied to power supply. Thus, the output voltages of the power supply are functions of time and are represented as $E_1(t)$ and $E_2(t)$; $E_1(t)$ being supplied to VTO #1 and $E_2(t)$ being supplied to VTO #2.

These power supply output voltages are offset by a predetermined amount in this case. The extent of the offset voltage is dependent upon the magnitude of the offset frequency desired between the reference frequency $f_R$ and the coherent offset frequency $f_C$. The voltage $E_2(t)$ is equal to $E_1(t) \pm \Delta E(t)$ where $\Delta E(t)$ is the incremental offset voltage necessary to drive VTO #2 at the $\pm f_{IF}$. The embodiment of the invention shown here is for a fixed offset; however, it is understood that a variable offset frequency could also be supplied and a suitable power supply designed having output voltages dependent upon the offset changes. The voltage tuned oscillators 12 and 16 are well known in the art to be extremely linear devices for the frequency bandwidth in which they are designed to operate.

Voltage tuned magnetrons are a form of voltage tuned oscillator, and are readily available in various RF bands; at S-band for example, a 2–4 KMC tuneable range is obtainable with extremely linear frequency tuning and a tuning sensitivity of 2 mc./volt. Assuming that VTO's #1 and #2 (both S-band) had the same voltage tuning response as cited, and the offset frequency is fixed at +30 mc., then the chart below illustrates typical operation of the power supply and frequencies produced at the voltage tuned oscillators.

| Time | $E_1(t)$ | $E_2(t)$ | $f_R$ (KMC) | $f_C$ (KMC) |
|---|---|---|---|---|
| $t_0$ | 500 v. | 515 v. | 2.00 | 2.03 |
| $t_1$ | 510 v. | 525 v. | 2.02 | 2.05 |
| $t_2$ | 520 v. | 535 v. | 2.04 | 2.07 |
| $t_3$ | 550 v. | 565 v. | 2.10 | 2.13 |
| $t_{n-1}$ | 1,000 v. | 1,015 v. | 3.00 | 3.03 |
| $t_n$ | 1,400 v. | 1,415 v. | 3.80 | 3.83 |

The voltages and frequencies shown in the chart are chosen at random, but may be predetermined by operation of the power supply in response to the programmer output waveform. By having a prior design knowledge as to the desired frequency offset, the frequency range of the tuneable oscillators, and voltage ranges required to tune through the range, the required power supply output voltages are achievable.

The frequency offset modulator 14 comprising the offset oscillator 22 and the modulator 21 is provided to supply an injection locking frequency to the circulator 13. A known fixed offset signal ($f_{IF}$) is supplied by the offset oscillator 22 to the modulator 21. The reference frequency $f_R$ is sampled by the directional coupler 15 and coupled to the modulator 21. By modulating the reference frequency signal $f_R$ with the offset oscillator frequency $f_{IF}$ the modulator produces a signal containing both the reference frequency and the offset frequency. Of course, a modulator could be provided which produces a signal $f_R$ plus $f_{IF}$ or $f_R$ minus $f_{IF}$ or even harmonics of $f_R$. Assuming that the frequency offset modulator output signal is $f_R$ plus $f_{IF}$ then $f_C$ is desired to be of the same frequency magnitude. Since the voltage to VTO #2 is offset by a voltage equivalent to the drive necessary to bring VTO #2 up to $f_C$, then VTO #2 will tend to oscillate at $f_C$. To establish coherency between VTO #1 and VTO #2 (i.e.: phase-coherent) the circulator 13 is provided to introduce the offset frequency ($f_C$) into VTO #2 which causes VTO #2 to oscillate precisely at $f_C$ and in synchronism with $f_R+f_{IF}$ and thereby establishing a coherent offset frequency $f_{IF}$ between VTO #1 and VTO #2.

Injection locking is a phenomenon familiar to those skilled in the art of oscillator operation. An article by Richard C. Mackey entitled "Injection Locking of Klystron Oscillators," appeared in the July 1962 IRE Transactions on Microwave Theory and Techniques. Basically, injection locking of an oscillator exploits the limited gain and noise characteristics of a typical oscillator. Since an oscillator starts by noise amplification (gain) which builds up to a point where maximum gain is achieved at the natural oscillator frequency, then the oscillator can be "pulled" to a frequency other than the natural oscillator frequency by injecting a signal of higher amplitude than the existing noise. This technique is sometimes known as "tickling" the oscillator. Tickling has been used in the past to establish frequency stability. It is known that the starting phase of an oscillator which is noise started is random. In the time domain, an oscillator starting phase may be anywhere between 0 and 360° from the previous oscillating period. In the embodiment shown in FIG. 2, VTO #2 is forced to emit its power at a frequency $f_R+f_{IF}$ (i.e.: $f_C$) by tickling to compensate for any voltage errors supplied. Also, starting phase of VTO #2 is locked to the same phase as the injected frequency signal. The phase-locking effect is also referred to as "synchronization tickling." Thus, in the present invention the "tickling" frequency supplied by the frequency offset modulator 14 "pulls" the frequency of the VTO #2 precisely to the desired oscillating frequency and offset in frequency with VTO #1 by the intermediate frequency. These voltage tuned oscillators (VTO #1 and VTO #2)

chart below shows a set of typical values during the mode of operation described in this example.

| TIME | $f_1$ VTO #1 (KMC) | $f_2$ VTO #2 (KMC) | $f_3$ VTO #3 (KMC) | Offset $f_{IF}$ |
|---|---|---|---|---|
| $t_1$ | 5.50 | 5.51 | Off | 10 mc. |
| $t_2$ | 5.60 | Off | 5.65 | 50 mc. |
| $t_3$ | 5.70 | 5.71 | Off | 10 mc. |
| $t_4$ | 5.10 | 5.11 | Off | 10 mc. |
| $t_5$ | 5.90 | Off | 5.95 | 50 mc. |

The example described here would find useful application in a frequency diversity radar. In prior art, the variation of offset frequency from a tuneable carrier is extremely difficult to do coherently. This invention provides frequency diversity, multiple channel transmissions over wideband carrier variations, and with variable separation among the RF carriers with simplicity.

Of course, if the offset oscillator 76 was fixed rather than variable, the coded program and power supply could compensate for a variety of offsets among the VTO's by altering the voltage for the starting frequency of each and compensating for the offset. In such case, each of the VTO's is injection locked by a variation among the modulator 75 output signals to the respective VTO's, rendering all the VTO's coherent with the reference VTO and each other.

While several embodimentos of the invention have been described, it is intended that the foregoing shall be considered only as illustrative of the principles of the invention and not limiting in any sense.

What is claimed is:

1. A wideband coherent frequency modulator for first and second tuneable sources of radio frequencies, comprising:

a driver, said driver means being coupled to the first and second tuneable sources of radio frequency for synchronously tuning the first tuneable source of radio frequency to a frequency which is offset with respect to the second tuneable source of radio frequency;

a frequency offset modulator coupled to the second tuneable source of radio frequency, for generating an output signal offset in frequency with respect to the second tuneable source; and a non-reciprocal hybrid circulator, said circulator being coupled between said frequency offset modulator and the first tuneable source of radio frequency for introducing the output signal offset in frequency into the first source for injection locking the frequency of the first source of radio frequency to the frequency of the output signal offset in frequency.

2. In a wideband coherent frequency modulator according to claim 1, wherein; said frequency offset modulator comprising:

an oscillator for generating a constant frequency output signal; and a modulator, said modulator being coupled to said oscillator and the second tuneable source of radio frequency for generating an output signal containing the constant frequency and the frequency of the second tuneable source of radio frequency.

3. A programmable coherent frequency modulator capable of wideband operation for a plurality of tuneable sources of radio frequencies comprising:

programmer means for generating a coded signal;

driving means coupled between said programmer means and the plurality of tuneable sources, for generating a plurality of driving signals $E_1(t)$ through $E_n(t)$ in accordance with said coded signal to drive each of said tuneable sources;

frequency offset modulator means coupled to said programmer means and operating in accordance with said coded signal, for generating a plurality of frequencies $f_1(t) \pm f_{IF}$ through $f_n(t) \pm f_{IF}$ interrelated by the predetermined offset frequency $f_{IF}$;

sampling means coupled between a selected tuneable source from one of said plurality of tuneable sources and said frequency offset modulator for sampling the frequency of said selected tuneable source and supplying a sample as a reference frequency $f_R(t)$ to said frequency offset modulator means; and a plurality of non-reciprocal hybrid means, each of said hybrid means coupled between a respective tuneable source from among said plurality of sources and said frequency offset modulator, for transferring a respective frequency from said frequency offset modulator to each of the respective tuneable sources, except said selected source, to injection lock the frequencies of each of said remaining tuneable sources in accordance with the respective frequency from said offset modulator, and establish a mutual starting phase among all said tuneable sources.

4. In a programmable coherent frequency modulator according to claim 4 wherein said frequency offset modulator comprises:

an oscillating means coupled to said programmer for generating a variable offset frequency in accordance with said coded signal; and modulator means coupled to said oscillating means and said sampling means for modulating said variable offset frequency with said reference frequency.

5. In a system for generating two coherent radio frequency signals, the system including first and second voltage tuneable sources of radio frequency signals, a wideband coherent frequency modulator comprising:

a power supply for providing a first and second output means for providing voltage signals variable with time and offset in voltage magnitude from each other, the first output means being coupled to first voltage tuneable source of radio frequency signals and the second output means being coupled to the second voltage tuneable source of radio frequency signals;

a frequency offset modulator for generating an output signal offset in frequency from the second voltage tuneable radio frequency signal, said frequency offset modulator being coupled to the second voltage tuneable source; and a non-reciprocal hybrid circulator for introducing the reference frequency into the first voltage tuneable source to injection lock the frequency and render the starting phase of the first voltage tuneable radio frequency signal coherent with the second voltage tuneable radio frequency signal, said circulator being coupled between said frequency offset modulator and the first voltage tuneable source of radio frequency signals.

6. In the system according to claim 5, wherein said wideband coherent frequency modulator includes:

a programmer coupled to said power supply for providing a pre-programmed coded signal to control the magnitude of the first and second output voltage signals.

7. A system for generating programmed coherent radio frequency intelligence comprising:

a programmer to provide an output signal having a predetermined coded waveform;

a power supply, said power supply being coupled to said programmer for providing first and second drive signals variable with time and in voltage magnitude in accordance with the coded waveform, the drive signals having a constant voltage magnitude difference;

a first voltage tuneable oscillator for generating a reference radio frequency output signal, said first oscillator being coupled to said power supply and including means for receiving the first drive signal;

a second voltage tuneable oscillator for generating a radio frequency output signal offset in frequency could be klystrons, backward wave oscillators, or voltage tuned magnetrons, thereby rendering this invention suitable for radar applications. The power supply 11 could be of simple design exploiting the characteristic of zener diodes to maintain a constant level offset voltage ($\Delta E(t)$) between the outputs $E_1(t)$ and $E_2(t)$. The programmer 10 illustrated, consisting of a square wave generator in the form of a multivibrator 17 which supplies a square wave signal to the integrator 18 generates a sawtooth-shaped code signal for use by the power supply 11. It is, of course, understood that the programmer 10 could generate any waveform in the form of a "code" to the power supply and need not be as simple as multibrator and integrator shown, but more complex code forms. Thus, no matter what the output reference frequency is, a coherent fixed offset frequency is also generated by this embodiment of the present invention. With broadband voltage tuned oscillators 12 and 16 in a transmitter embodying this invention, then a broadband receiver would employ the reference signal frequency 23 to maintain continuous tuning of the transmission with the speed of response provided by the VTO's, rather than the limited response problem previously discussed with AFC's. Receiver sampling connections would be made to the reference signal output 23 and transmitter drive to the offset signal output 24. When the receiver is at a remote location the difference between 24 and 23 would be generated in the receiving mixer and be extracted as the desired "IF" signal.

Another variation on the embodiment shown in FIG. 1, would include function generators inserted in the circuit shown between the power supply 11 and each of the VTO's. These function generators would cause each of the VTO's to respond differently to the same code signal, but the coherent offset would still be maintained. Although many variations are possible, this embodiment of the invention permits two tuneable oscillators, offset in frequency, to be rendered coherent by the simple technique of supplying an adequate synchronizing drive signal derived from either tuneable oscillator through a modulator, and slewing one tuneable oscillator with respect to the other.

FIGS. 3*a*–3*d* illustrates the variety of carrier intelligence available by applications of the present invention. FIG. 3*a* illustrates the CW dynamic following capability of the present invention. A time versus frequency plot is shown. The line plot 41 represents the reference signal and the line plot 40 represents the coherent offset signal which follows the reference signal. A dynamic offset frequency $\Delta f$ is maintained and is constant with any change of the reference in time and frequency. This dynamic following capability would be useful in the transmitter of a communications system for providing a beacon reference in the receiver.

FIG. 3*b* illustrates the CW dynamic offset tuning application of the present invention. If we let the bandwidth of the voltage tuned oscillators be represented by the frequency from $\omega$ to $\omega'$, then the spectral lines 42 ($f_R$) and 43 ($f_C$) are maintained at a constant offset frequency $\Delta f$ across the complete bandwidth of the tuneable oscillators. Such an application would permit a receiver of such transmitted CW to have rapid access to the information contained within the two transmitted signals because the offset is known.

There is shown in FIG. 3*c* a power spectrum of a pulsed FM application of the coherent frequency modulator. Such a spectrum is generated by pulsing the control grids of the tuneable oscillators to turn them on and off in time as well as changing the frequency. The spectrum 44 represents a pulse from the reference voltage tuned oscillator and the pulse 45 represents the pulse occurring at the same time from the second voltage tuned oscillator and separated by the offset frequency $\Delta f$. The reference and offset frequencies for each pulse occurs at maximum power.

In FIG. 3*d* a typical chirp FM power spectrum is shown for two chirped pulses, 48 and 49. Once again, the center frequencies $f_R$ and $f_C$, 50 and 51 respectively, for each pulse is known and is coherent; however, the desire here is to provide a signal $f_R$ and an image $f_C$ separated by 2 $\Delta f$. Chirp radars are well known to those skilled in the field of radar and is described in the article "The Theory and Design of Chirp Radars," by J. R. Klauder et al. in the Bell Systems Technical Journal, July 1960. Chirping refers to the transmission of a signal having a changing frequency with time and such change may be either increasing from a lower frequency to a higher frequency or vice versa. A common problem with pulse or chirp radar operating at high repetition rates arises in conjunction with what is known as "second go-around" signals. Second go-around signals refers to return echo signals from a ($n$–1) pulse transmission arriving at the receiver during the time interval in which echoes from the $n$–th pulse transmission are expected. Cases arise where a $n$–1 chirp pulse is sent out and goes beyond the anticipated range of the radar and the echo returns come back from both the anticipated range illuminated with the ($n$–1) pulse and from an unexpected longer range. When a second ($n$th) pulse is transmitted and received from the expected range in given time interval, some signal is also returned from the unexpected range illuminated by the first pulse, then confusion occurs. The confusion is commonly referred to as "range ambiguity." Ambiguity exists because two pulse returns occurred in the same time interval (range) from two different illuminating pulses. This phenomenon is minimized by sequentially coding the pulses with an FM signal such as 49 and the image 52. Both chirp pulse signals 52 and 49 are generated simultaneously in the modulator 21 of FIG. 2. The VTO #2 (12) can be made to reproduce the chirp pulses 52 or 49 by appropriate application of waveform $E_2(t)$ such that a position or negative waveform allows the desired synchronization. Since compression of coded chirp signals requires the opposite or a conjugate waveform, the reference oscillator VTO #1 (16) shown in FIG. 2 provides coherent code waveform 48 required in the receiver reception at the offset ($\Delta f$) frequency.

Turning now to FIG. 4, there is shown a wideband coherent frequency modulator for generating a plurality of wideband coherently modulated RF carriers with variable offset frequencies. A plurality of VTO's, indicated by 72 (VTO #1 through VTO($n$)), being driven by a plurality of voltage signals $E_2(t)$ through $E_n(t)$ respectively. The programmer 70 generates multiple outputs, each output providing the necessary coordinating or control signals for operating the variable frequency offset modulator 74 in a particular mode. The variable frequency modulator 74 generates the output frequencies necessary for each of the voltage tuned oscillators, 72, each of which is offset from the reference VTO #1. This variable frequency offset modulator 74 consists of the modulator 75 and variable offset oscillator 76. Outputs from the variable frequency offset modulator are shown to be $f_1+f_{IF(1)}$ to $f_1+f_{IF(n)}$, but could be any frequency which includes the reference ($f_1$) and some offset frequency ($f_{IF}$).

For example, assume the bandwidth of VTO #1 through 3 is 1 KMC in the tuneable range of 5 KMC to 6 KMC, and VTO #2 is desired to be offset from the VTO #1 by + 10 mc., and a VTO #3 is to be offset by 50 mc.; the VTO #2 and the VTO #3 being alternately pulsed, according to the program code. The variable offset oscillator 76 could be tuneable or have selectable crystal oscillators, but for exemplary purposes, it will be assumed to be selectable; i.e.: a first crystal for 10 mc. and a second crystal for 50 mc. A program code signal synchronizes the offset oscillator 76 with the power supply 71, the proper VTO, and connects the 10 mc. crystal offset during the time of operation for the VTO #2 and the 50 mc. crystal during operation of the VTO #3. The from said reference frequency as determined by the constant voltage difference, said second oscillator including means for receiving the second drive signal;

a frequency offset modulator, including a fixed frequency oscillator coupled to a modulator, the fixed frequency of the fixed frequency oscillator corresponding to the offset frequency established by the constant voltage difference between the first and second drive signals, and the modulator being coupled to said first voltage tuneable oscillator and including means for receiving a sample of the reference frequency output signal, for providing a modulated signal comprised of the reference radio frequency signal and offset by the fixed frequency; and a hybrid circulator coupled to said frequency offset modulator and the second voltage tuneable oscillator for carrying the modulated signal radio frequency energy from said frequency offset modulator to the second voltage tuneable oscillator and from the voltage tuneable oscillator to an output terminal of said circulator, the radio frequency modulated signal energy causing the second voltage tuneable oscillator to generate the precise frequency provided by said frequency offset modulator and being phase synchronized with the reference frequency.

8. In the system according to claim 7, wherein said first and second voltage tuneable oscillators are voltage tuneable magnetrons.

9. In a radar system having a receiver and a transmitter, the transmitter including first and second voltage tuneable oscillators with frequencies being command controlled simultaneously by a programmer, and the tuned frequency of the first tuneable oscillator being provided as a reference frequency for the receiver, an improved wideband coherent frequency modulator comprising:

a variable power supply being coupled to said programmer for providing first and second drive voltage signals in accordance with said programmer command control and having a predetermined offset voltage corresponding to the frequency offset commanded, said power supply including means for applying said drive voltage signals to said first and second voltage tuneable oscillators respectively;

an offset frequency oscillator for providing a fixed offset frequency corresponding to the offset frequency produced by the offset voltage;

a frequency mixer being coupled to said offset frequency oscillator and said first voltage tuned oscillator for mixing the fixed offset frequency with the frequency of said first voltage tuneable oscillator to derive an output signal containing the fixed offset frequency and the frequency of said first tuneable oscillator, the derived output signal corresponding to the commanded offset frequency; and a circulator having first, second, and third ports in an arrangement whereby energy entering said first port is directed to said second port and energy entering said second port is directed toward said third port, said first port being coupled to said mixer, said second port being coupled to said second voltage tuned oscillator and said third port being the output port, for carrying said mixer output signal to said second voltage tuned oscillator to injection lock the output frequency of said second voltage tuned oscillator precisely to the commanded offset frequency.

References Cited

UNITED STATES PATENTS

| | | | |
|---|---|---|---|
| 3,127,572 | 3/1964 | McLeod | 331—55 |
| 3,176,246 | 3/1965 | Boiten | 325—433 X |
| 3,249,937 | 5/1966 | As et al. | 343—14 |
| 3,290,678 | 12/1966 | Carlsson | 343—14 X |

RODNEY D. BENNETT, *Primary Examiner.*

J. P. MORRIS, *Assistant Examiner.*